United States Patent
Lanka et al.

(10) Patent No.: US 12,153,458 B2
(45) Date of Patent: Nov. 26, 2024

(54) METHOD FOR IMPLEMENTING AN I/O BUFFER

(71) Applicant: XILINX, INC., San Jose, CA (US)

(72) Inventors: Sasi Rama Subrahmanyam Lanka, Challapalli (IN); Vss Prasad Babu Akurathi, Hyderbad (IN); Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/082,921

(22) Filed: Dec. 16, 2022

(65) Prior Publication Data

US 2024/0201718 A1   Jun. 20, 2024

(51) Int. Cl.
    *H03K 17/687* (2006.01)
    *G05F 1/56* (2006.01)

(52) U.S. Cl.
    CPC ............ *G05F 1/56* (2013.01); *H03K 17/6872* (2013.01); *H03K 17/6874* (2013.01)

(58) Field of Classification Search
    None
    See application file for complete search history.

(56) References Cited

U.S. PATENT DOCUMENTS

| | | | | |
|---|---|---|---|---|
| 5,917,358 A * | 6/1999 | Sanchez | ......... | H03K 19/018585 327/333 |
| 6,323,687 B1 * | 11/2001 | Yano | ................ | H03K 19/00384 326/27 |
| 6,342,802 B1 * | 1/2002 | Forehand | ................ | H03K 17/22 327/143 |
| 6,836,148 B2 * | 12/2004 | Pullen | .............. | H03K 19/00315 327/434 |
| 7,619,444 B1 * | 11/2009 | Shaikh | ........... | H03K 19/017545 327/309 |
| 7,642,810 B2 * | 1/2010 | Kang | ................ | H03K 19/00384 327/109 |
| 8,183,891 B2 * | 5/2012 | Naganawa | ....... | H03K 19/00384 327/170 |
| 8,570,072 B2 * | 10/2013 | Gozali | ................. | H03K 3/3565 327/63 |
| 9,344,088 B1 * | 5/2016 | Sanchez | ......... | H03K 19/018521 |
| 10,224,922 B1 * | 3/2019 | Tiwari | ........... | H03K 19/018521 |
| 10,763,840 B1 * | 9/2020 | Tan | ....................... | H03K 3/3565 |
| 11,108,396 B2 * | 8/2021 | Sanchez | ........... | H03K 3/356182 |
| 11,223,358 B2 * | 1/2022 | Sanchez | ......... | H03K 19/018521 |
| 2022/0416792 A1 * | 12/2022 | Kumar | ........... | H03K 19/018521 |

* cited by examiner

*Primary Examiner* — Thomas J. Hiltunen
(74) *Attorney, Agent, or Firm* — Patterson + Sheridan, LLP

(57) ABSTRACT

An input/output (I/O) buffer is implemented without an auxiliary power supply (VCCAUX). The input/output (I/O) buffer includes a connection to a VCCO power supply, a connection to a VCCINT power supply, a connection to a reference voltage, and a VCCO detection circuit coupled to a bias generation circuit. Further, the I/O buffer includes a transmitter circuit coupled to the bias generation circuit, and a receiver circuit coupled to an I/O pad.

20 Claims, 9 Drawing Sheets

METHOD FOR IMPLEMENTING AN I/O BUFFER

TECHNICAL FIELD

Examples of the present disclosure generally relate to input/output (I/O) buffers, and to a method for implementing a high voltage I/O buffer independent of an auxiliary power supply.

BACKGROUND

Integrated circuit (IC) devices use various voltages during operation. In some instances an IC device includes high voltage general purpose input/output (I/O) circuits. High voltage general purpose I/O circuits use three separate voltages during operation. For example, a first voltage (VCCINT) is the core power supply for the digital logic circuitry, a second voltage (VCCAUX) is the auxiliary power supply used to protect the devices of an integrated circuit, and a third voltage (VCCO) is the buffer power supply or the I/O power supply.

An IC device includes one or more interconnected semiconductor dies. The interconnected semiconductor dies use power supply bumps to route the voltages between the semiconductor dies. In such instances, the use of three different voltages complicates the power sequencing processes of the corresponding IC device, and the bump plan of the corresponding IC device.

SUMMARY

These and other examples may be understood with reference to the following detailed description. One example is a method for implementing a high voltage I/O buffer without need for an auxiliary power supply (VCCAUX). The method comprises receiving in a high voltage I/O buffer circuit: a buffer power supply (VCCO) connection, a core power supply (VCCINT) connection; a reference voltage connection (REF), and a data signal input. A VCCO voltage level is detected in a VCCO detection circuit coupled to a bias generation circuit. Control signals received in a control logic circuit are coupled to level shifter circuitry. Pdata and Ndata are received from the level-shifter circuitry in a two stage driver/pre-driver circuit. The pre-driver circuit drives a driver circuit, which transmits the data to an I/O PAD accessible to the external world in the VCCO domain. Similarly, in the receive mode the signal on the I/O PAD is fed to the receiver circuit. The receiver circuit translates the signal from the VCCO domain to the VCCINT domain and sends the signal to the Core of the chip through the control logic circuit as the I_data signal.

In one example, an input/output (I/O) buffer includes a connection to a VCCO power supply, a connection to a VCCINT power supply, a connection to a reference voltage, and a VCCO detection circuit coupled to a bias generation circuit. Further, the I/O buffer includes a transmitter circuit coupled to the bias generation circuit, and a receiver circuit coupled to an I/O pad.

In one example, an input/output (I/O) buffer including a connection to a VCCO power supply, a connection to a VCCINT power supply, and a connection to a reference voltage. Further, the I/O buffer includes a data input coupled to a control logic circuit, a plurality of control signals coupled to the control logic circuit, level-shifter circuits coupled to the control logic circuit, and pre-driver circuits coupled to the level-shifter circuits. The I/O buffer further includes driver circuits coupled to the pre-driver circuits, a bias generation circuit coupled to the level-shifter circuits and the driver circuits, a VCCO detection circuit coupled to the bias generation circuit, and a receiver circuit coupled to an I/O pad.

In one example, a method for implementing an input/output (I/O) buffer includes connecting to a VCCO power supply, connecting to a VCCINT power supply, and receiving a reference voltage (REF) in a VCCO detection circuit. Further, the method includes transmitting VCCO detect signals from the VCCO detection circuit to a bias generation circuit, receiving bias voltages in a transmitter circuit from the bias generation circuit, and receiving data in a receiver from an I/O pad.

BRIEF DESCRIPTION OF THE DRAWINGS

So that the way the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
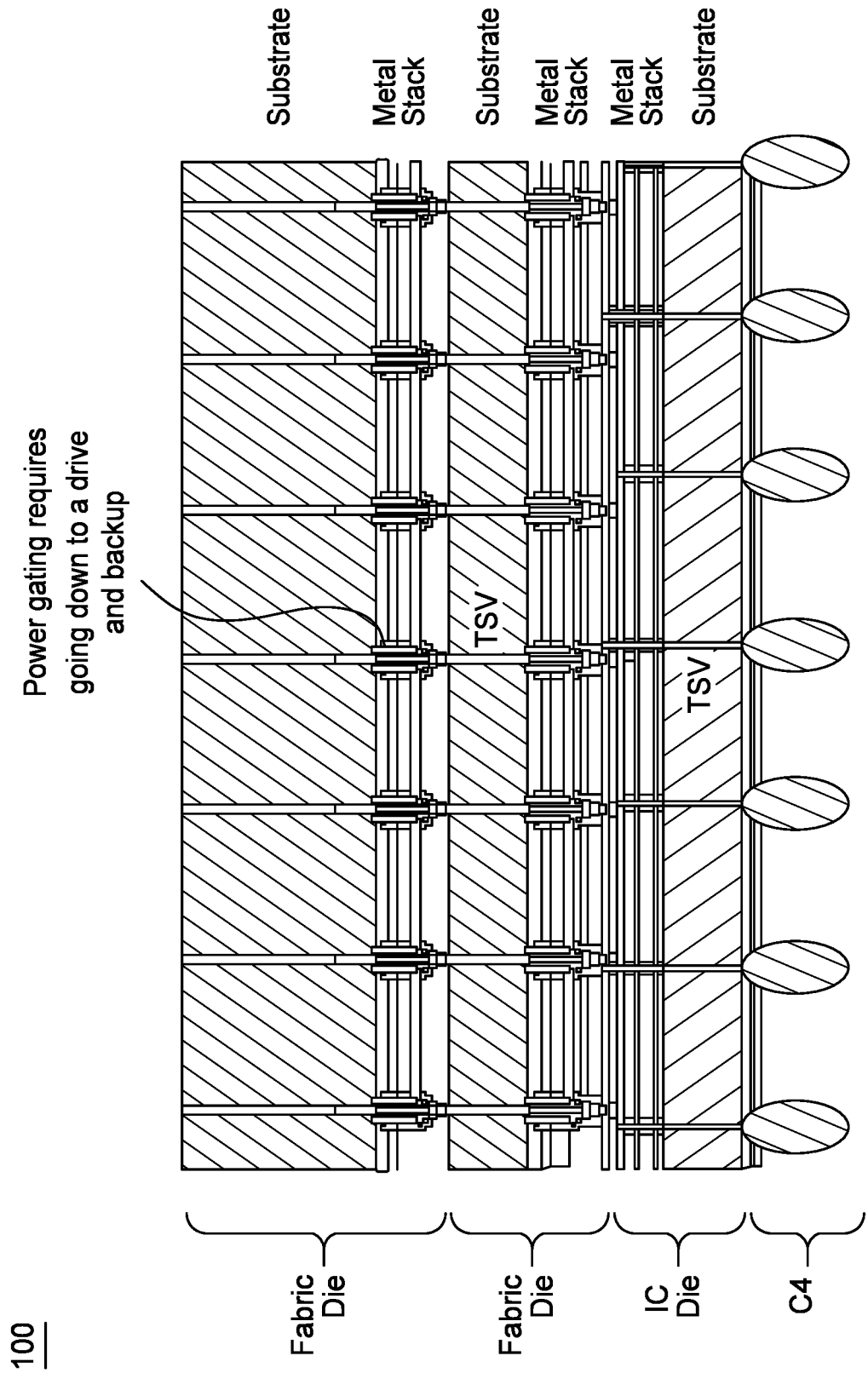
FIG. 1 illustrates an example, according to one example, of a North/South slice view of a power delivery network for a 3D chip.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Integrated circuit (IC) devices may include high voltage general purpose input/output I/O circuits that operate according to three voltages. For example, a first voltage (VCCINT) is a core power supply voltage, a second voltage (VCCAUX) is an auxiliary power supply voltage used to protect the devices, and a third voltage (VCCO) is a buffer power supply voltage.

In one example, the term "high voltage" refers to voltages 1.98v or greater (i.e., 1.8+/10%) when 1.8v tolerant metal-oxide-semiconductor field-effect (MOSFET) transistors are used in the design. In other examples, "high voltage" refers to other voltage levels. "High voltage" I/O design involves designing various circuitries like transmitter circuitry (Tx), receiver circuitry (Rx), and bias circuitries that are driven based on various voltages. A bias circuitry provides safe bias voltages to the Tx blocks and Rx blocks. Various design techniques are disclosed here to eliminate the use of VCCAUX in the I/O circuits, simplifying the corresponding circuit design. For example, in previous designs, core signals are translated to the VCCAUX domain and then to the VCCO domain. The architecture has been re-designed as described in the following to convert core signals directly to the VCCO domain.

As will be described in greater detail in the following, omitting the VCCAUX domain from an I/O circuit simplifies the corresponding IC device design. For example, the routing of power supply signals within an IC device is simplified, simplifying and reducing the connections between IC devices, reducing design time and corresponding manufacturing costs.

In an Rx, the VCCAUX power supply signal is omitted by replacing the VCCAUX power supply signal with a bias voltage generated from the VCCO power supply. Bias voltage are generated using a resistor divider in the VCCO domain, as opposed to generating reference-based currents in the VCCAUX domain and then feeding those currents into a resistor to generate desired voltages in the VCCO domain. In one example, the resistor dividers are controlled by supply detect signals, which differentiate between 1.8 to 2.5V to 3.3V. In addition to the above design changes, a VCCO detection circuit (comparator) design is modified to work on VCCINT, remove the dependence on the VCCAUX power supply.

Prior art I/O Buffers may comprise many circuit blocks, including:
1) VCCO detection blocks
2) Bias Generation blocks
3) Control Logic blocks
4) Level-Shifter blocks
5) Pre-driver and Driver blocks
6) Receiver blocks These circuit blocks may utilize VCCAUX for various reasons. Designing these circuit blocks such that VCCAUX is omitted, then the VCCAUX power supply can be removed from those circuit blocks.

The removal of VCCAUX provides a few advantages, including:
1) Fewer power bumps.
2) Better signal integrity.
3) Better Duty Cycle Distortion (DCD). DCD is defined as the change in duty cycle. Duty Cycle is defined as the ratio of on time period to total Time period of a signal.
4) A Lower Layout area.
5) Fewer De-Coupling capacitors. These capacitors are generally placed between the power supply and ground to improve signal integrity)
6) Fewer power sequence issues.
7) Ease in verification. In examples where there are are 3 power supplies, the transistor reliability of an IC device in checked in 6 sequences. However, by omitting VCCAUX, 2 sequences instead of 3 sequencies are used to check for transistor reliability of an IC device.

Prior art VCCO detection circuits utilized comparators and VCCAUX to detect the VCCO 2.5v mode and the 3.3v mode. In these detectors, VCCO>= to 2.325v is considered a "high voltage VCCO level", and VCCO<=1.89v is considered a "low voltage VCCO level". In prior art, bias voltages in transmitter and receiver circuits are generated for NMOS gates and for PMOS gates using VCCAUX and VCCO power supplies.

The benefits achieved by the new high voltage I/O buffer power supply design are:
1. The VCCAUX power supply is successfully removed from all the circuit blocks.
2. Approximately four VCCAUX power bumps are eliminated in the I/O Bank Region, i.e., ~10% bump reduction.
3. Reduced area due to removal of VCCAUX Decap (decoupling capacitor) in the I/O Bank Region, i.e., ~5% of the I/O bank area.
4. Good signal integrity due to Decap optimization
5. Less complexity in power sequence verification
6. Improved performance (DCD improved from ~+/−5% to +/−3%).

The following figures and description provide a more detailed description with regard to how the VCCAUX is removed or replaced from various designs.

FIG. 1 illustrates an example, according to one example, of a North/South slice view of a power delivery network for a 3D chip 100. A 3D chip may include several layers of Fabric Die and IC Die over C4. C4 refers to bumps that extend out of the chip.

Three-dimensional (3D) chip devices may contain multiple system on a chip (SOC) circuits. These devices can be easily damaged by excess supply voltages.

The Metal Stack refers to the stacking of available metals in the technology node. TSV refers to Through Silicon Via, which connects different silicon Dice in a 3D structure.

Figure 2:
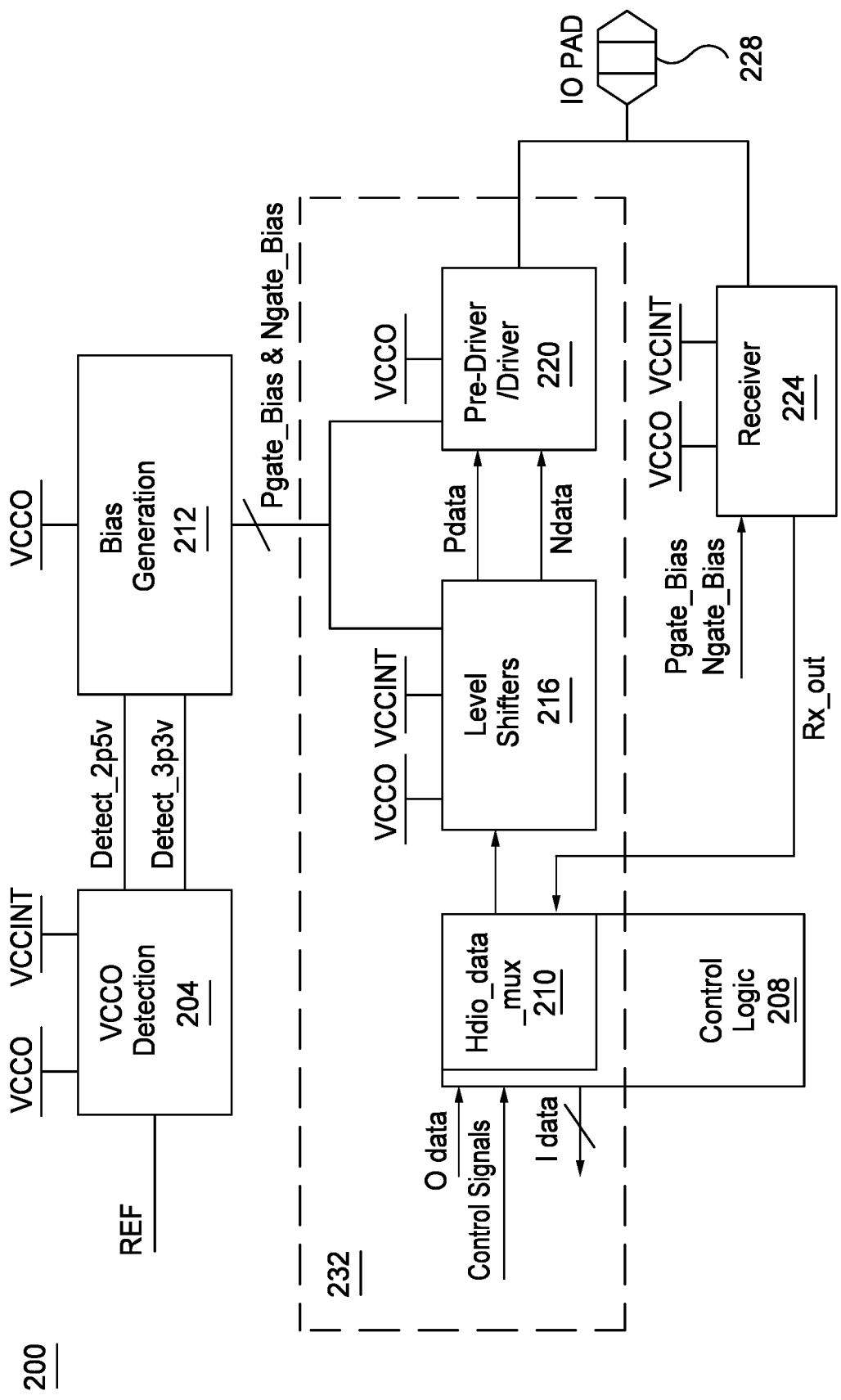
FIG. 2 illustrates an example, according to one example, of a block diagram of a proposed high voltage I/O buffer without a VCCAUX power supply.

FIG. 2 illustrates an example, according to one example, of a block diagram of a proposed High Voltage I/O Buffer 200 that does not utilize a VCCAUX power supply.

The High Voltage I/O Buffer 200 includes a VCCO connection, a VCCINT connection, a REF connection, a plurality of control signal inputs, and a data input. Pgate_Bias and Ngate_Bias bias voltages are generated within the bias generation circuit 212. Pdata is the input to the pull-up side of the Pre-driver/driver 220. Ndata is the input to the pull-down side of the Pre-driver/driver 220.

The transmitter circuit 232 (Tx) is contained in the dashed rectangle.

In this block diagram the VCCAUX power supply has been removed.

The VCCO detection circuit 204 compares the percentage of VCCO voltage against a Reference (REF) voltage and generates two logic signals, Detect_2p5v and Detect 3p3v. These two logic signals are fed to the bias generation circuit 212. Depending upon the logic value of these signals, the bias generation circuit alters the voltage of Pgate_Bias and Ngate_Bias The High Voltage I/O Buffer 200 operates in several modes, including a transmit mode, receive mode, tristate mode, etc. Control logic circuit 208 is a combinational logic circuit that includes the Hdio_data_mux 210. Depending upon the mode of I/O operation and the data logic value, the Hdio_data_mux 210 decides the logic values of Pdata_hv and Ndata_hv (not shown). Depending upon the values of the control signals, the control logic circuit 208 sets the High Voltage I/O Buffer 200 to specific modes of operation.

The bias generation circuit 212 generates two bias voltages Pgate_bias and Ngate_bias, depending upon the value of the VCCO power supply voltage. These two bias voltages change to maintain MOS transistor reliability.

The HV Level-Shifter circuits 216 comprise high voltage level-shifter circuits that translate the data signals Pdata_hv and Ndata_hv from the VCCINT domain to the VCCO domain.

Figure 5:
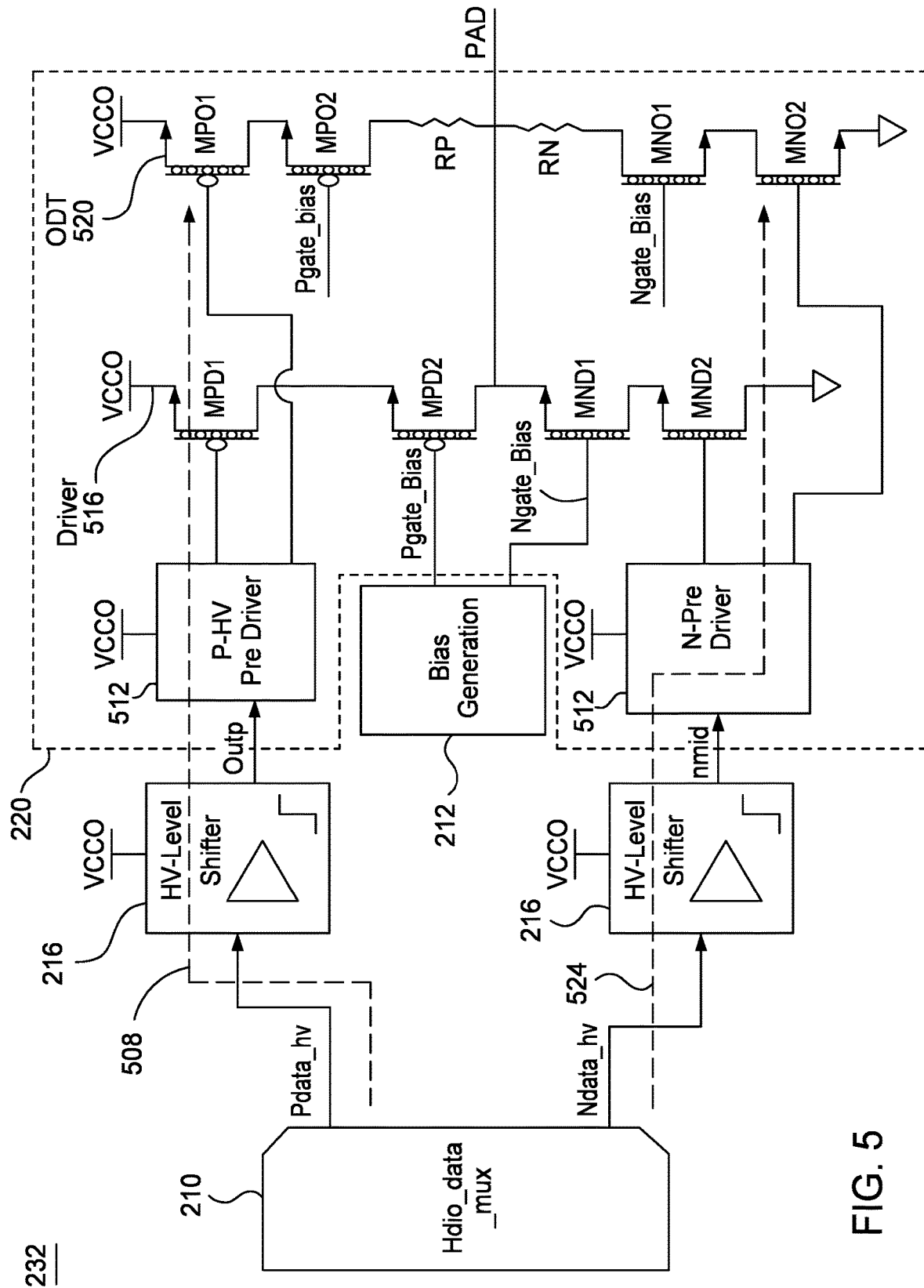
FIG. 5 illustrates an example, according to one example, of a block diagram of a new transmitter implementation.

A Pre-driver/Driver circuit 220 is comprised of a Pre-driver circuit FIG. 5, 512 and a Driver circuit FIG. 5, 516. As the HV Level-Shifter circuits 216 cannot drive the Driver circuit 516 directly (due to loading), the Pre-driver circuit 512 acts as a high voltage buffer in between the HV Level-Shifter circuit 216 and Driver circuit 516. The Pre-driver/Driver circuit 220 drives the signal on to the I/O PAD 228.

A receiver circuit 224 translates the signal from the VCCO domain to the VCCINT domain and sends the signal to the core of the chip through the control logic circuit 208 as the I_data signal.

In transmit mode, the I/O PAD 228 transmits the High Voltage I/O Buffer 200 output data. In receive mode, the I/O PAD 228 receives the output data and sends it to the receiver circuit 224

Figure 3:
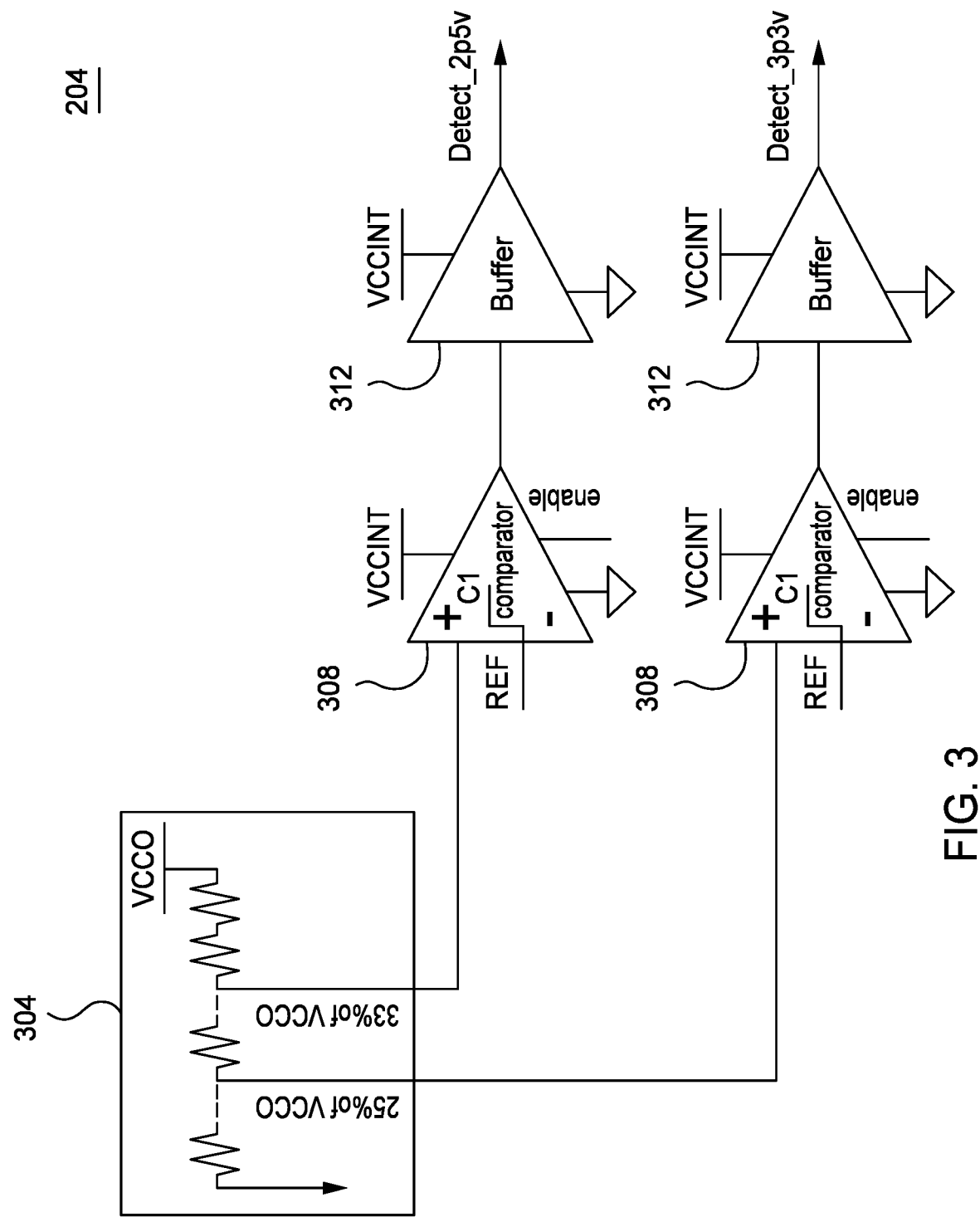
FIG. 3 illustrates an example, according to one example, of a new implementation of a VCCO detection circuit.

FIG. 3 illustrates an example, according to one example, of a new implementation of a VCCO detection circuit 204.

REF is an external reference voltage for I/O. VCCINT level signals (Detect_2p5v and Detect_3p3v) are generated by comparing the percent of VCCO against the reference voltage. The VCCINT level signals are then used to generate bias voltages which protect devices in Tx and Rx circuits from reliability issues.

A resistor divider circuit 304 is coupled to the VCCO power supply. The resistor divider circuit 304 is tapped at two levels, i.e., 25% and 33% of VCCO. These two resistor taps are connected to comparator circuits C1 308 and C2 308.

The comparator circuits C1 308 and C2 308 receive VCCINT and compare the percent of VCCO against the reference voltage.

The VCCO detection circuit 204 produces VCCO detect signals Detect_2p5v and Detect_3p3v, which serve to detect VCCO voltage levels. The buffers 312 serve to buffer the comparator circuits 308, as the detect signals Detect_2p5v and Detect 3p3v may be subject to high loading.

Figure 4:
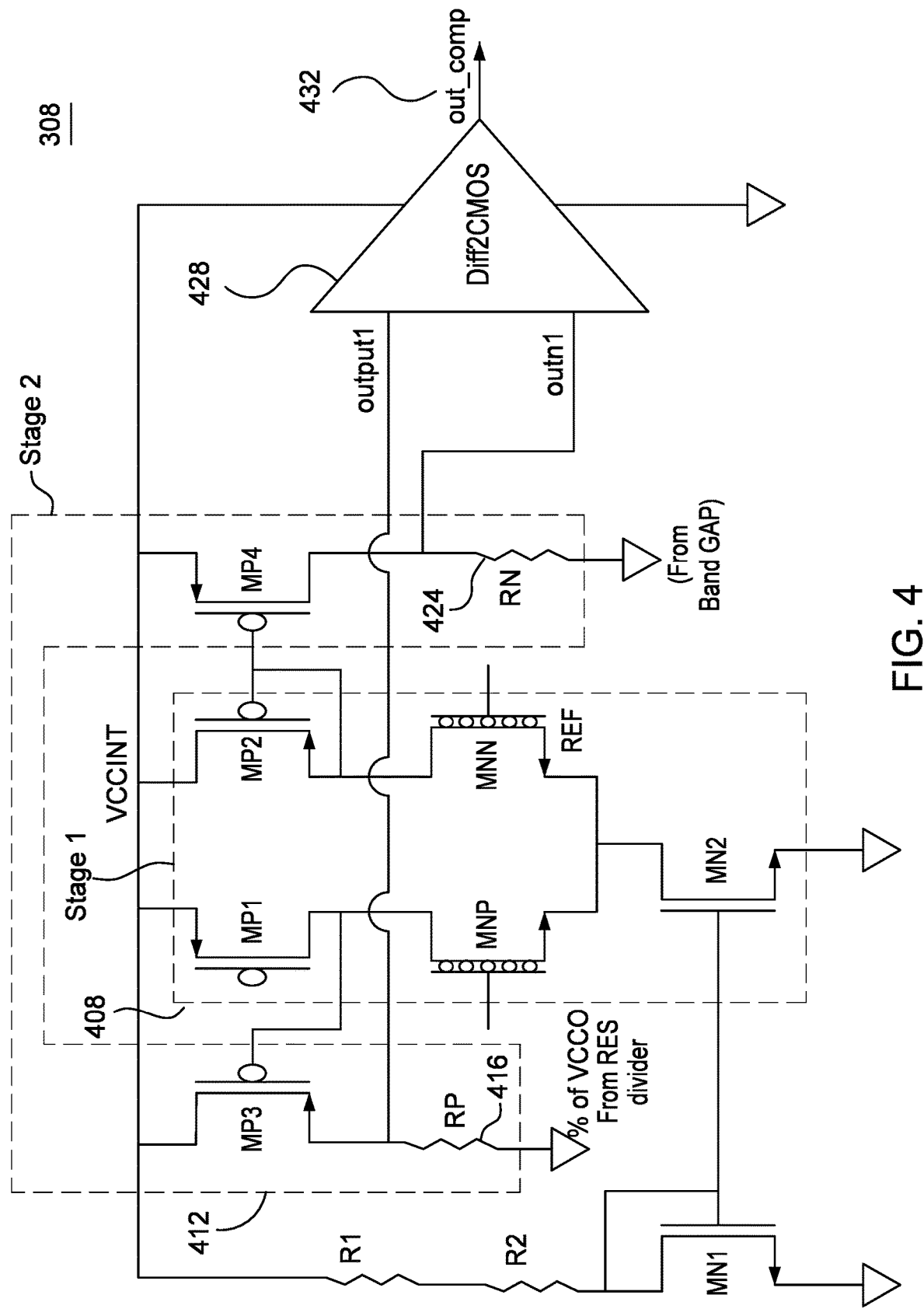
FIG. 4 illustrates an example, according to one example, of a VCCINT comparator circuit.

FIG. 4 illustrates an example, according to one example, of a VCCINT comparator circuit 308. In prior art designs, the comparator circuits operate from the VCCAUX power supply. In the new design disclosed here, the comparator circuits C1 and C2 (FIG. 3, 308) operate from the VCCINT power supply. The VCCINT comparator circuits 308 are two stage comparator circuits each with Stage 1 408 and Stage 2 412, followed by a differential to CMOS converting stage 428. Stage 1 408 comprises a NMOS differential transistor pair with a PMOS diode load, whereas Stage 2 412 comprises a PMOS common source amplifier with resistor loads RN 424 and RP 416. Resistors R1-R2, and transistor MN1 provide bias to the Stage1 408 amplifier. As the comparator circuit 308 is operating on the VCCINT power supply and is independent of VCCAUX, the porb_VCCAUX gating voltage used in prior art comparators is removed in the new VCCO detection circuit. The trip point calculation of the VCCO detection circuit is the same as in prior art designs, only the tapping points are changed in accordance with the REF value.

Output1 and outn1 are the output signals of Stage 2 412. These two signals are fed to the differential to CMOS converter Diff2CMOS circuit 428. Out_comp 432 is the output signal of Diff2CMOS circuit 428. When the % of VCCO is higher than the REF voltage, the out_comp 432 level will be logic high, otherwise it will be logic low.

In the new design, the detect_2p5v and detect_3p3v trip points in the VCCAUX independent VCCO detection circuit work well with good tripping margins.

FIG. 5 illustrates an example, according to one example, of a block diagram of a new transmitter circuit 232 (Tx) implementation. In the prior art Tx implementations, there are two primary blocks which are using the VCCAUX power supply, 1) the Level-shifter and 2) the Pre-driver. In the new Tx block diagram, the VCCAUX power supply has been removed.

The Pdata_hv high voltage path 508 is shown as a dashed line exiting from Hdio_data_mux 210. The Ndata_hv high voltage path 524 is shown as a dashed line exiting from Hdio_data_mux 52410.

A Hdio_data_mux 210 is a combinational logic circuit. Depending upon the mode of I/O operation and the data logic value, the Hdio_data_mux 210 decides the logic value of Pdata_hv and Ndata_hv.

The transmitter circuit 232 includes a plurality of High Voltage (HV) Level-Shifter circuits 216. A HV Level-Shifter circuit 216 translates the Pdata_hv voltage to the VCCO domain, and a HV Level-Shifter circuit 216 translates the Ndata_hv voltage to the VCCO domain. The output of the Pdata_hv HV Level-Shifter circuit 216 is the signal Outp and the output of the Ndata_hv HV Level-Shifter circuit 216 is the signal nmid.

The outputs of the HV Level-Shifter circuits 216 are coupled to the Pre-driver/driver circuit 220. The P-HV Pre-driver circuit 512 and the N-Pre-driver circuit 512 are high voltage buffers placed between the HV Level-Shifter circuits 216 and the Driver circuit 516 to avoid excessive loading on the High Voltage Level-Shifter circuits 216.

The N Pre-driver circuit 512 is the same as the P HV Pre-driver circuit 512, except that the N Pre-driver circuit 512 is placed in the Ndata_hv path.

The Driver circuit 516 is a transistor circuit. Transistors MPD1 and MPD2 are the pull-up portion of the Driver circuit 516. Transistors MND1 and MND2 are the pull-down portion of the Driver circuit 516.

The on-die termination circuit (ODT) 520 is a transistor circuit. In receive mode and when termination is enabled, the ODT circuit 520 turns ON all four transistors MPO1, MPO2, MNO1 and MNO2. Once the ODT is turned ON, the I/O PAD's impedance value is set to a particular value in accordance with the specification.

The bias generation circuit 212 is a resistor ladder circuit. Depending upon the logic values of Detect_2p5v and Detect_3p3v, the bias generation circuit 212 adjusts the bias voltages, namely Pgate_Bias & Ngate_Bias.

In transmit mode, the I/O PAD 228 transmits output data from the High Voltage I/O Buffer 200. In receive mode, the I/O PAD receives output data from a remote transmitter and sends it to the receiver circuit 224. The transmitter circuit 232 output is at the I/O PAD connection.

In the prior art Level-Shifter designs, the data signals are level-shifted from the VCCINT power domain to the VCCAUX power domain in the first stage. In the second stage, the VCCAUX data signal is level-shifted to the VCCO I/O buffer power domain. In the new design, this two stage level-shifting is replaced by a single stage level-shifter where the core domain data is level-shifted to the VCCO I/O buffer power domain.

Figure 6:
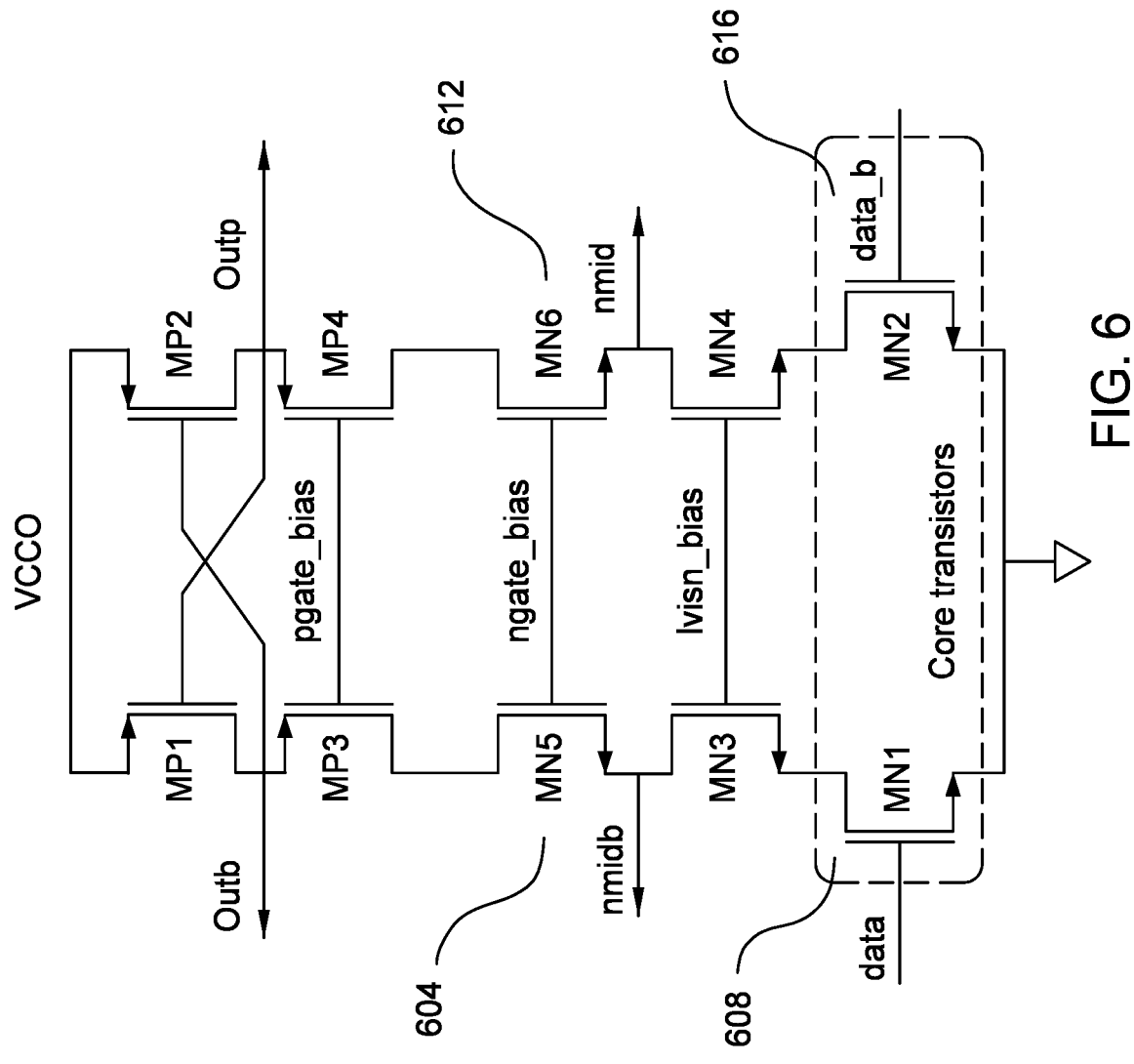
FIG. 6 illustrates an example, according to one example, of a new implementation of a data level-shifter circuit.

FIG. 6 illustrates a new implementation of a high voltage (HV) Level-Shifter circuit 216. The prior art two stage level-shifting design is replaced by a single stage level-shifter circuit where the VCCINT core power domain data is level-shifted to the VCCO I/O buffer power domain. Here, MN1 608 and MN2 616 are the core transistors which are driven by core signals data and data_b, which are complimentary to each other. The core transistors MN1 608 and MN2 616 utilize low threshold voltages that serve as good overdrive voltages at lower core voltages. This also helps to achieve higher data rates.

Transistor MN3 in left circuit 604 and transistor MN4 in right circuit 612 are driven by a bias voltage lvlsh_bias equal to 1V in a typical value. Transistors MN5 in left circuit 604 and MN6 in right circuit 612 are driven by a bias voltage ngate_bias which is equal to ~1.8V. Similarly, transistors MP3 in left circuit 604 and MP4 in right circuit 612 are driven by pgate_bias which is equal to ~VCCO-1.8V. These bias voltages are needed to preserver the reliability of the devices.

Transistors MP1 in left circuit 604 and MP2 in right circuit 612 are powered by VCCO, the I/O buffer power supply voltage which can reach up to 3.3v+5%. Signals Outp and Outb will switch from VCCO-1.8+vtp to VCCO, whereas the signals nmid and nmidb toggle from 0V to ngate_bias-vtn. Vtp refers to the threshold voltage of the transistor MP4 in right circuit 612 and Vtn refers to the threshold voltage of the transistor MN6 in right circuit 612. Thus, this level-shifter doesn't need VCCAUX, and the protective biases are generated from the VCCO/I/O buffer power supply voltage.

Signal Outp is an output of the Pdata_hv HV Level-Shifter 216, as shown in FIG. 5. Signal nmid is an output of the Ndata HV Level-Shifter 216, as shown in FIG. 5. The signal Outb is the complement to Outp. The signal nmidb is the complement to nmid.

Figure 7:
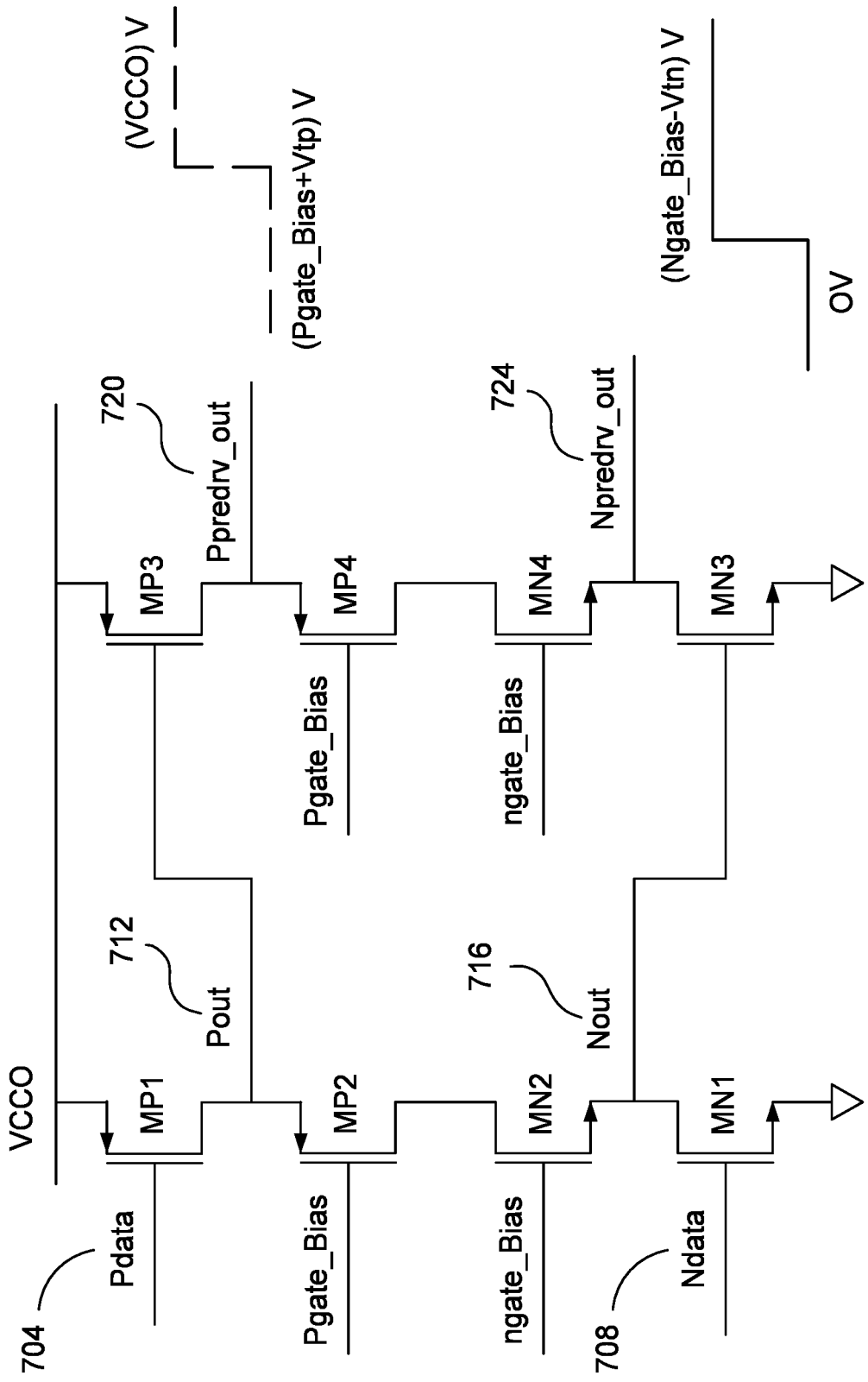
FIG. 7 illustrates an example, according to one example, of a new implementation of a pre-driver.

FIG. 7 illustrates an example, according to one example, of a new implementation of a Pre-driver circuit 512. The earlier N-pre-driver and LV Mode P-pre-drivers are powered by the VCCAUX domain. In FIG. 7, this is replaced by the following stacked structure powered by the VCCO voltage. The FIG. 7 Pre-driver circuit 512 is an example of either the P-HV Pre-driver circuit 512 or the N-Pre-driver circuit 512 shown in FIG. 5.

The Pre-driver circuit 512 has 2 stages. The first stage receives a signal as Ndata 708 and Pdata 704. Ndata 708 swings from 0V to Ngate_Bias-Vtn volts, whereas Pdata 704 swings from Pgate_Bias+Vtp volts to VCCO. These two signals will be received on transistors Nmos MN1 and Pmos MP1 respectively. The first stage has two outputs, Pout 712 and Nout 716 which drive the second stage transistors MP3 and Nmos MN3.

The Pre-driver circuit 512 has two outputs:
1) Npredrv_out 724 swings from 0V to Ngate_Bias-vtn. This drives the bottom NMOS transistor MND2 of the Driver circuit 516 in FIG. 5.
2) Similarly, Ppredrv_out 720 swings from (Pgate_Bias+Vtp to VCCO) to drive the top PMOS transistor MPD1 of the Driver circuit 516 in FIG. 5.

In this way, the data path is identical for both low voltage and high voltage mode. This resolves issues that occur during I/O mode changes from high voltage to low voltage, or from low voltage to high voltage. The issues may include glitches observed at the output due to different delays in low voltage and high voltage data paths in prior art implementations. Maintaining the same data path also helps in keeping a lower DCD as both the P pre-driver and the N pre-driver work on the same supply and the same signal swing to the driving transistors (FIG. 5, MPD1 and MND2).

The biases used are Ngate_bias, which is ~1.8V (a typical value) and Pgate_Bias, which is equal to ~VCCO-1.8 (typical value). These are generated from the VCCO domain. In this way, the VCCAUX dependency is removed in the Tx Path.

Figure 8:
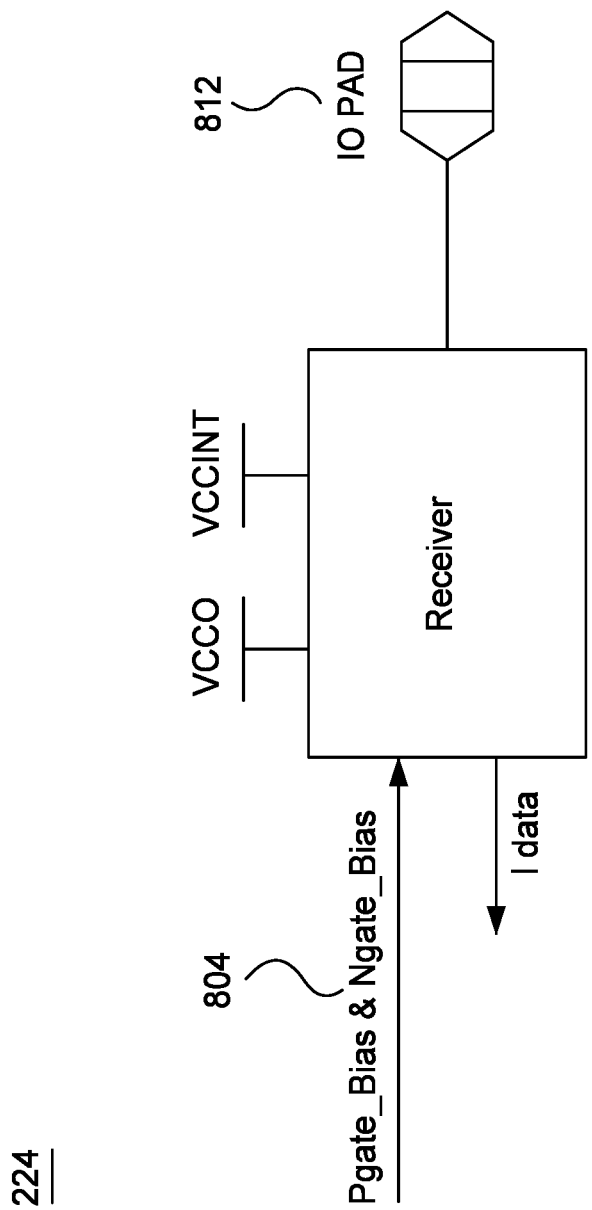
FIG. 8 illustrates a Receiver Block Diagram in a new implementation.

FIG. 8 illustrates a receiver circuit 224 in a new design.

In prior art designs, the Receiver design VCCAUX power supply is used to protect the devices in High Voltage mode (2.5V and 3.3V) and translate the voltage. The Receiver receives input data from the I/O PAD 812. In the new design, Pgate_Bias and Ngate_Bias 804, which are generated from the VCCO power supply, replace the VCCAUX power supply for the protection of devices against high voltage and level shifting of the signal.

Figure 9:
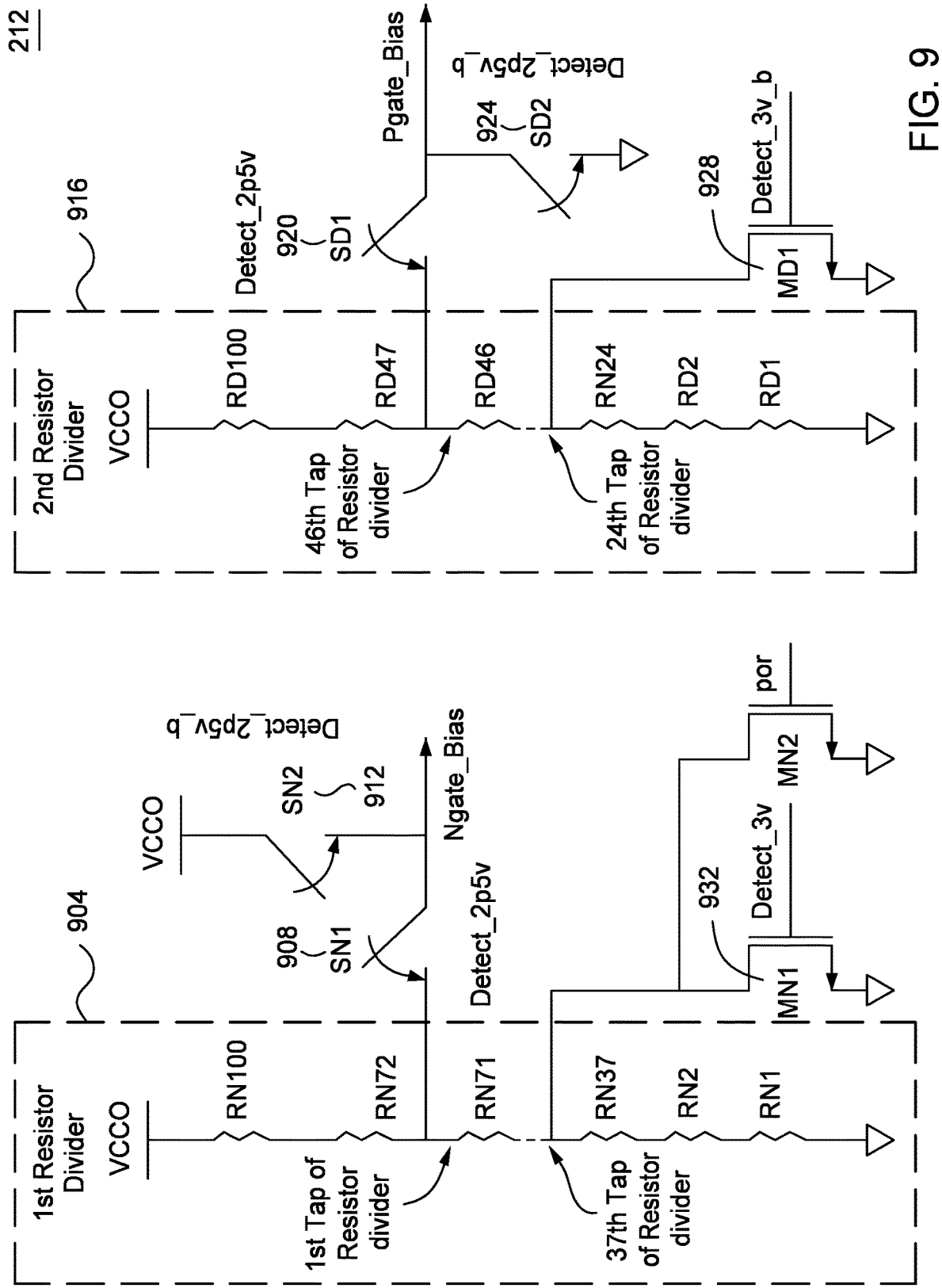
FIG. 9 illustrates an example, according to one example, of a new implementation of a bias generation circuit.

FIG. 9 illustrates an example, according to one example, of a new implementation of a bias generation circuit 212.

The VCCO detection circuit 204 generates two signals. One signal is Detect_3v and the other signal is Detect_2p5v. The logic high value of Detect 3V indicates that the I/O buffer is in 3.3v mode (the VCCO value will be in the vicinity of 3.3V). The logic high value of Detect_2p5v indicates that the I/O buffer is in high voltage mode (the VCCO value is greater than 1.8V+5%). With the help of these two signals, the bias voltages (Ngate_Bias and Pgate_Bias) are generated. There are two resistor divider circuits 904, 916 in the bias generation circuit 212 and each divider has one hundred resistors whose values are equal.

Table 1 displays the logic values of the Detect_2p5v and Detect_3v in different modes.

TABLE 1

| VCCO Power Supply Mode | Detect_2p5v | Detect_3v |
|---|---|---|
| 1.8 V Mode | 0 | 0 |
| 2.5 V Mode | 1 | 0 |
| 3.3 V Mode | 1 | 1 |

1.8V Mode Description: During 1.8V mode, Detect_2p5v is equal to logic zero and Detect_2p5v_b is equal to logic one. In this mode, switches SN1 908, SD1 920 are open and SN2 912, SD2 924 are closed. As SN2 912, SD2 924 are closed, Ngate_bias is shorted to VCCO (~1.8V) and Pgate_Bias is shorted to ground.

2.5V Mode Description: During 2.5v mode, Detect_2p5v and Detect_3v_b are equal to logic one and Detect_2p5v_b and Detect_3v are equal to logic zero. In this mode, switches SN1 908, SD1 920 are closed and SN2 912, SD2 924 are open. As SN1 908, SD1 920 are closed, the 71st tap of the first resister divider 904 is shorted to Ngate_Bias, and the 46th tap of the 2nd resistor divider 916 is shorted to Pgate_bias. The Detect_3v_b signal is logic high and turns on transistor MD1 928. Transistor MD1 928, when turned on, bypasses 24 resistors in the 2nd resistor divider 916. Under this condition, Ngate_Bias=71% of VCCO (~1.78V for VCCO=2.5v) and Pgate_bias=29% of VCCO(~0.73V for Vcoo=2.5V)

3.3V Mode Description: During 3.3v mode, Detect 2p5v and Detect_3v are equal to logic one, while Detect_2p5v_b and Detect_3v_b are equal to logic zero. Under this condition, switches SN1 908 and SD1 920 are closed and switches SN2 912 and SD2 924 are open. As SN1 908 and SD1 920 are closed, the 71st tap of the first resistor divider 904 is shorted to Ngate_Bias and the 46th tap of the 2nd resistor divider 916 is shorted to Pgate_bias. The Detect_3v signal is logic high and turns on transistor MN1 932. Transistor MN1 932, when turned on, bypasses 37 resistors in the first resistor divider 904. In this mode, Ngate_Bias=54% of VCCO (~1.78v for VCCO=3.3V) and Pgate_bias=46% of VCCO (~1.52V for Vcoo=3.3V).

In Table 2, the simulation results of Ngate_bias and P-gate_bias values are displayed for different modes (1.8v, 2.5v and 3.3v modes of VCCO).

TABLE 2

| Supply Mode | 1.8 v Mode | | | 2.5 V Mode | | | 3.3 v Mode | | |
|---|---|---|---|---|---|---|---|---|---|
| Vcco (in Volts) | 1.71 | 1.8 | 1.89 | 2.325 | 2.5 | 2.625 | 3.069 | 3.3 | 3.465 |
| Ngate_bias (in Volts) | 1.71 | 1.8 | 1.89 | 1.65 | 1.775 | 1.863 | 1.657 | 1.782 | 1.87 |
| Pgate_bias (in Volts) | 0 | 0 | 0 | 0.674 | 0.725 | 0.761 | 1.411 | 1.518 | 1.593 |

The methods disclosed herein comprise one or more steps or actions for achieving the methods. The method steps and/or actions may be interchanged with one another. In other words, unless a specific order of steps or actions is specified, the order and/or use of specific steps and/or actions may be modified.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database, or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, a digital signal processor (DSP), an application specific integrated circuit (ASIC), or a processor (e.g., a general purpose or specifically programmed processor). Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise several software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

While the foregoing is directed to specific examples, other and further examples may be devised without departing from the basic scope thereof, and the scope thereof is determined by the claims that follow.

What is claimed is:

1. An input/output (I/O) buffer comprising:
   a connection to a VCCO power supply;
   a connection to a VCCINT power supply;
   a connection to a reference voltage;
   a VCCO detection circuit coupled to a bias generation circuit;
   a transmitter circuit coupled to the bias generation circuit, the transmitter circuit having a single-stage level-shifter circuit, wherein the VCCO detection circuit is coupled to the single-stage level-shifter circuit through the bias generation circuit such that core power domain data associated with the VCCINT power supply is level-shifted to a power domain of the VCCO power supply; and
   a plurality of pre-driver circuits coupled to the single-stage level-shifter circuit, each pre-driver circuit powered by the VCCO power supply, and each pre-driver circuit having a first stage including first transistors and a second stage including second transistors, the first stage having two outputs to drive the second transistors in the second stage.

2. The I/O buffer of claim 1, wherein the bias generation circuit further comprises a plurality of resistor divider circuits configured to generate bias voltages using the VCCO power supply.

3. The I/O buffer of claim 1, wherein the VCCO detection circuit is configured to produce low voltage and high voltage VCCO detect signals.

4. The I/O buffer of claim 1, wherein the VCCO detection circuit further comprises:
   a resistor divider circuit;
   a plurality of two stage comparator circuits coupled to the VCCINT power supply; and
   a plurality of buffers.

5. The I/O buffer of claim 4, wherein each two-stage comparator circuit further comprises:
   a NMOS differential transistor pair;
   a PMOS common source amplifier; and
   a differential to CMOS converting stage.

6. The I/O buffer of claim 1, wherein the transmitter circuit further comprises:
   a control logic circuit configured to decide I/O buffer modes;
   an on-die termination circuit; and
   an I/O pad connection.

7. The I/O buffer of claim 1, wherein the transmitter circuit further comprises:
   a control logic circuit configured to decide I/O buffer modes; and
   a driver circuit coupled to the plurality of pre-driver circuits.

8. The I/O buffer of claim 7, wherein an output of the single-stage level-shifter circuit is fed directly into a pre-driver circuit of the plurality of pre-driver circuits acting as a high-voltage buffer.

9. The I/O buffer of claim 1, wherein the single-stage level-shifter circuit further comprises a high voltage level-shifter circuit.

10. The I/O buffer of claim 1, wherein the plurality of pre-driver circuits further comprise a P pre-driver and an N pre-driver.

11. An input/output (I/O) buffer comprising:
    a connection to a VCCO power supply;
    a connection to a VCCINT power supply;
    a connection to a reference voltage;
    a data input coupled to a control logic circuit;
    a plurality of control signals coupled to the control logic circuit;
    a single-stage level-shifter circuit;
    a plurality of pre-driver circuits coupled to the single-stage level-shifter circuit, each pre-driver circuit powered by the VCCO power supply, and each pre-driver circuit having a first stage including first transistors and a second stage including second transistors, the first stage having two outputs to drive the second transistors in the second stage;
    driver circuits coupled to the plurality of pre-driver circuits;
    a bias generation circuit coupled to the driver circuits; and
    a VCCO detection circuit coupled to the single-stage level-shifter circuit through the bias generation circuit such that core power domain data associated with the VCCINT power supply is level-shifted to a power domain of the VCCO power supply.

12. A method for implementing an input/output (I/O) buffer comprising:
   connecting to a VCCO power supply;
   connecting to a VCCINT power supply;
   receiving a reference voltage (REF) in a VCCO detection circuit;
   transmitting VCCO detect signals from the VCCO detection circuit to a bias generation circuit;
   receiving bias voltages in a transmitter circuit from the bias generation circuit, the transmitter circuit having a single-stage level-shifter circuit, wherein the VCCO detection circuit is coupled to the single-stage level-shifter circuit through the bias generation circuit; and
   coupling a plurality of pre-driver circuits to the single-stage level-shifter circuit, each pre-driver circuit powered by the VCCO power supply, and each pre-driver circuit having a first stage including first transistors and a second stage including second transistors, the first stage having two outputs to drive the second transistors in the second stage.

13. The method of claim 12, wherein the bias generation circuit further comprises a plurality of resistor divider circuits configured to generate bias voltages using the VCCO power supply.

14. The method of claim 12, wherein the VCCO detection circuit is configured to produce low voltage and high voltage VCCO detect signals.

15. The method of claim 12, wherein the VCCO detection circuit further comprises:
   a resistor divider circuit;
   a plurality of two stage comparator circuits coupled to the VCCINT power supply; and
   a plurality of buffers.

16. The method of claim 15, wherein the two stage comparator circuits further comprise:
   NMOS differential transistor pairs;
   PMOS common source amplifiers; and
   differential to CMOS converting stages.

17. The method of claim 12, wherein the transmitter circuit further comprises:
   a driver circuit coupled to the plurality of pre-driver circuits.

18. The method of claim 17, wherein the transmitter circuit further comprises:
   a control logic circuit configured to decide I/O buffer modes;
   an on-die termination circuit; and
   an I/O pad connection.

19. The method of claim 12, wherein an output of the single-stage level-shifter circuit is fed directly into a pre-driver circuit of the plurality of pre-driver circuits acting as a high-voltage buffer.

20. The method of claim 12, wherein the single-stage level-shifter circuit comprises a high voltage level-shifter circuit.

* * * * *